United States Patent [19]
Murray

[11] Patent Number: 5,654,671
[45] Date of Patent: Aug. 5, 1997

[54] COMPENSATION CIRCUIT FOR INPUT STAGE OF HIGH SPEED OPERATIONAL AMPLIFIER

[75] Inventor: Kenneth W. Murray, Tucson, Ariz.

[73] Assignee: Burr-Brown Corporation, Tucson, Ariz.

[21] Appl. No.: 533,000

[22] Filed: Sep. 25, 1995

[51] Int. Cl.$^6$ ............................... H03F 3/45; H03F 1/14
[52] U.S. Cl. ............................... 330/255; 330/292
[58] Field of Search ............................... 330/252, 255, 330/288, 292, 311

[56] References Cited

U.S. PATENT DOCUMENTS

| | | | |
|---|---|---|---|
| 4,893,091 | 1/1990 | Lillis et al. | 330/288 X |
| 4,954,769 | 9/1990 | Kalthoff | 330/260 X |
| 5,079,514 | 1/1992 | Mijuskovic | 330/292 X |
| 5,477,190 | 12/1995 | Brehmer et al. | 330/292 X |

Primary Examiner—Steven Mottola
Attorney, Agent, or Firm—Cahill, Sutton & Thomas

[57] ABSTRACT

A compensation circuit in a high speed integrated circuit operational amplifier that includes an input stage having first and second outputs connected to emitters of first and second PNP cascode transistors. A base of an NPN cascode transistor is coupled to a collector of the first PNP cascode transistor. A resistor circuit is connected between the collectors of the second PNP cascode transistor and the NPN cascode transistor. First and second inputs of a diamond follower output buffer are connected to the collectors of the NPN cascode transistor and second PNP cascode transistor, respectively. A compensation circuit includes first and second compensation capacitors connected to the collectors of the NPN cascode transistor and the second PNP cascode transistor, respectively, to prevent instability of an output voltage of the diamond follower buffer circuit.

7 Claims, 3 Drawing Sheets

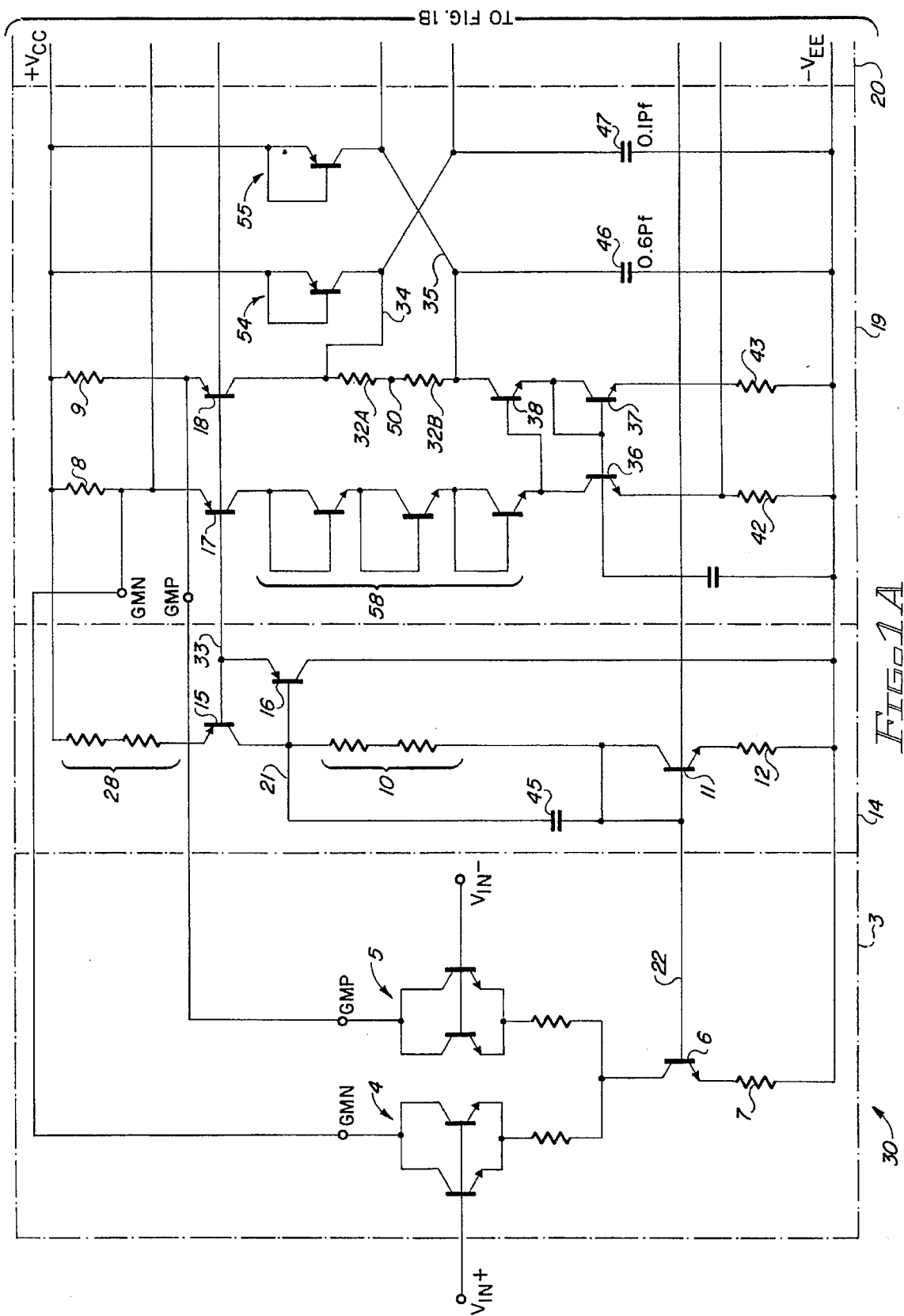

COMPENSATION CIRCUIT FOR INPUT STAGE OF HIGH SPEED OPERATIONAL AMPLIFIER

BACKGROUND OF THE INVENTION

The invention relates to a technique for compensating the output produced by an input stage of a high speed integrated circuit operational amplifier, and more particularly to providing a pair of linear compensation capacitors to compensate relatively large and small collector-to-substrate capacitances of a PNP "folded cascode" transistor and an NPN cascode transistor, respectively, the collectors of which apply two output signals with a constant voltage difference between them to the bases of PNP and NPN input transistors of a diamond follower buffer circuit.

FIG. 2 shows a known prior art technique of applying a pair of output signals that have a constant voltage difference between them to the PNP and NPN input transistors, respectively, of a diamond follower buffer. This technique provides a constant voltage difference between conductors 34 and 35 connected to the base electrodes of diamond follower input transistors 51 and 52, respectively, and was developed to reduce the "standing current" or quiescent current through output transistors 56 and 57 without having to use excessively large physical sizes of the input transistors 51 and 52 (see FIG. 1B) of the diamond follower.

PNP transistor 18 is a "folded cascode" vertical transistor, the emitter of which is coupled to the output of an input stage which is not shown in FIG. 2, but is shown as stage 3 in FIG. 1A. The base of folded cascode transistor 18 is connected to the base of a PNP current mirror control transistor 15 as in FIG. 1A. The collector-to-substrate capacitance $C_{CS(18)}$ of PNP folded cascode transistor 18 is quite high, and in fact is approximately 20 times greater than the collector-substrate capacitance $C_{CS(38)}$ of NPN cascode transistor 38, due to the characteristics of the manufacturing process used to fabricate "vertical" PNP transistors in the integrated circuit.

A pair of low value resistors 32A and 32B are connected in series between the collector of PNP folded cascode transistor 18 and the collector of NPN cascode transistor 38. The bias current through the series-connected string of elements including PNP folded cascode transistor 18, resistors 32A and 32B, and NPN cascode transistor 38 establishes a constant voltage drop across the pair of resistors 32A and 32B and hence between conductors 34 and 35. Conductors 34 and 35 are connected to the base electrodes of NPN input transistor 52 and PNP input transistor 51, respectively, of a diamond follower 20. PNP junction capacitors 54 and 55 are connected as shown between conductors 34 and 35, respectively, to improve differential gain and phase of operational amplifier 30. In accordance with the closest prior art known to the applicant, only one linear compensation capacitor 46A is provided, as shown in prior art FIG. 2; it has a value of 0.5 picofarads and is connected between $-V_{EE}$ and the conductor 50 joining resistors 32A and 32B.

However, the prior art capacitive compensation technique shown in FIG. 2 does not provide the capacitive compensation needed to avoid the instability (i.e., oscillation) shown by character A in waveform 60 of FIG. 3. Such instability is, of course, completely unacceptable in a high frequency operational amplifier.

SUMMARY OF THE INVENTION

Accordingly, it is an object of the invention to provide an improved high speed integrated circuit operational amplifier, and more specifically, to provide therein an improved capacitive compensation circuit and technique to eliminate instability or "ringing" of the operational amplifier output signal in response to large transitions of an input signal applied to the operational amplifier.

Briefly described, and in accordance with one embodiment thereof, the invention provides a compensation circuit in a high speed integrated circuit operational amplifier that includes an input stage (3) having first and second outputs, first (17) and second (18) PNP cascode transistors, an emitter of the first PNP cascode transistor (17) being coupled to the first output and an emitter of the second PNP cascode transistor (18) being coupled to the second output, an NPN cascode transistor (38) having a base electrode coupled to a collector of the first PNP cascode transistor (17), a collector-to-substrate capacitance ($C_{CS(38)}$) of the NPN cascode transistor (38) being much lower in value than a collector-to-substrate capacitance ($C_{CS(18)}$) of the second PNP cascode transistor, a resistive circuit (32A,32B) coupled between a collector of the second PNP cascode transistor (18) and a collector of the NPN cascode transistor (38), and a diamond follower output buffer having a first input coupled to the collector of the second PNP cascode transistor (18) and a second input coupled to the collector of the NPN cascode transistor (38). The improvement includes a first compensation capacitor (46) coupled between a supply voltage conductor ($V_{EE}$) and the collector of the NPN cascode transistor (38) and a second compensation capacitor (47) coupled between the supply voltage conductor and the collector of the second PNP cascode transistor (18), to prevent instability of an output voltage ($V_{OUT}$) of the diamond follower buffer circuit (20) for high and low levels of the output voltage ($V_{OUT}$).

In the described embodiment, the first and second compensation capacitors are composed of metal-insulator-semiconductor structures. The first compensation capacitor has a value of approximately 0.6 picofarads and the second compensation capacitor (47) has a value of approximately 0.1 picofarads. The input stage includes first and second NPN emitter-coupled input transistors having their inputs coupled to a constant current source circuit (6) and their collectors connected, respectively, to emitters of the first and second PNP cascode transistors. A base electrode of the NPN cascode transistor (38) is coupled by a plurality of level shifting diodes (58) to a collector of the first PNP cascode transistor (17), and also is connected to the collector of an NPN current mirror output transistor (36) having its base electrode connected to the base electrode of an NPN current mirror control transistor (37) having its base and collector connected to the emitter of the NPN cascode transistor (38).

BRIEF DESCRIPTION OF THE DRAWINGS

FIGS. 1A and 1B constitute a schematic diagram of a presently preferred embodiment of the present invention.

DETAILED DESCRIPTION OF THE PREFERRED EMBODIMENTS

Figure 1B:
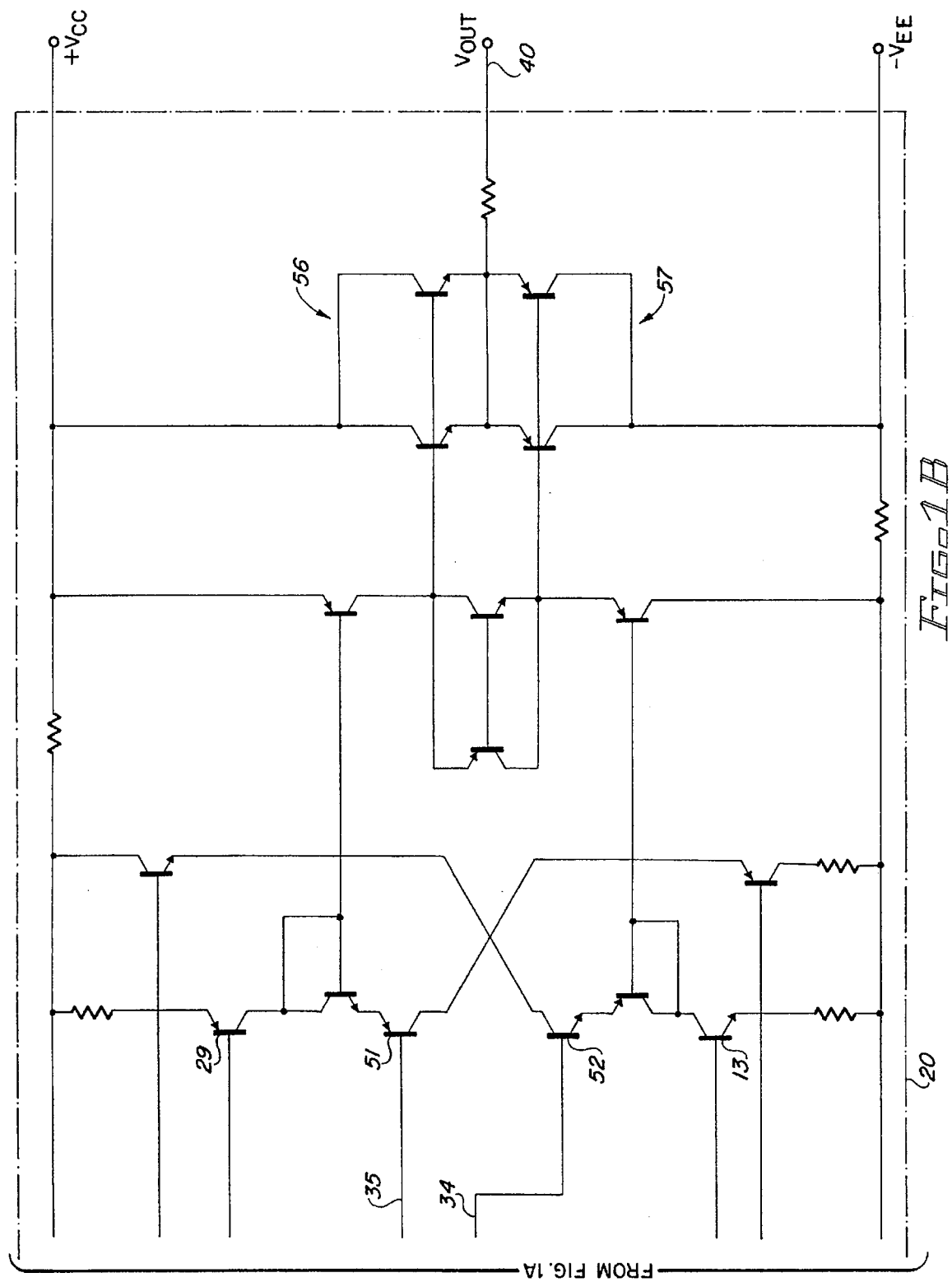

The high speed operational amplifier 30 of FIGS. 1A and 1B includes a differential input stage 3 including NPN input transistors 4 and 5. (Input transistors 4 and 5 each are split into two parallel-connected sections which are symmetrically disposed about a thermal centerpoint or thermal centroid to improve thermal aspects of the chip in which operational amplifier 30 is fabricated.) The differential input signal of operational amplifier 30 is applied between the base electrodes of input transistors 4 and 5. The emitters of input transistors 4 and 5 are connected to an NPN current mirror output transistor 6, the emitter of which is coupled through a low value resistor 7 to the negative power supply voltage $-V_{EE}$. $-V_{EE}$ typically is $-5$ volts. The collectors of input transistors 4 and 5 are coupled by load resistors 8 and 9, respectively, to the positive supply voltage $+V_{CC}$, which typically is $+5$ volts. The collectors of input transistors 4 and 5 also are coupled to the emitters of PNP "folded cascode" transistors 17 and 18 included in gain stage 19.

The bases of PNP "folded cascode" transistors 17 and 18 are connected by conductor 33 to the base of PNP current mirror control transistor 15. The emitter of PNP current mirror control transistor 15 is connected through a low value resistor 28 to the positive power supply voltage $+V_{CC}$. The base of PNP current mirror control transistor 15 also is connected to the emitter of a PNP "darlington" transistor 16, the base of which is connected by conductor 21 to the collector of PNP transistor 15 and to one terminal of a current source circuit 10. (Current source 10 includes a resistor schematically drawn to represent the impedance thereof.) The "darlington" transistor 16 is needed to reduce error in the PNP current source output transistor collector currents due to the low beta of PNP transistors manufactured using typical "high speed" bipolar manufacturing processes. Conductor 33 also is connected to the base of a PNP current mirror output transistor 29 to establish operating current for diamond follower 20. Conductor 21 also is connected to one terminal of compensation capacitor 45. Capacitor 45 compensates an internal feedback loop formed by PNP current mirror control transistor 15 and PNP darlington input transistor 16, and causes power supply "noise" or "glitches" in the operational amplifier of FIGS. 1A and 1B to couple equal amounts of current into conductors 21 and 22, and also causes noise to be coupled equally to the base electrodes of both PNP current mirror control transistor 15 and the NPN current mirror control transistor 11. Approximately balanced PNP and NPN current mirror responses to such "glitches" are thereby achieved.

An NPN current mirror control transistor 11 has its collector and base connected by conductor 22 to a second terminal of current source 10. Conductor 22 also is connected to the base of NPN current mirror output transistor 6 and to the base of an NPN current mirror output transistor 13 which establishes operating current for diamond follower 20. A low value resistor 12 is connected between the emitter of NPN current source control transistor 11 and $-V_{EE}$. The emitters of transistors 6 and 13 are also connected by low value resistors to $-V_{EE}$.

The collectors of PNP folded cascode transistors 17 and 18 are connected to other circuitry in gain stage circuit 19 which produces a constant voltage of approximately 200 millivolts across resistors 32A and 32B and thereby produces a first output signal on conductor 34 and a second output signal on conductor 35 which is 200 millivolts lower than the first output signal. The two output signals on conductors 34 and 35 are applied to the base electrodes of NPN diamond follower input transistor 52 and the base of PNP diamond follower input transistor 51, respectively.

Figure 2:
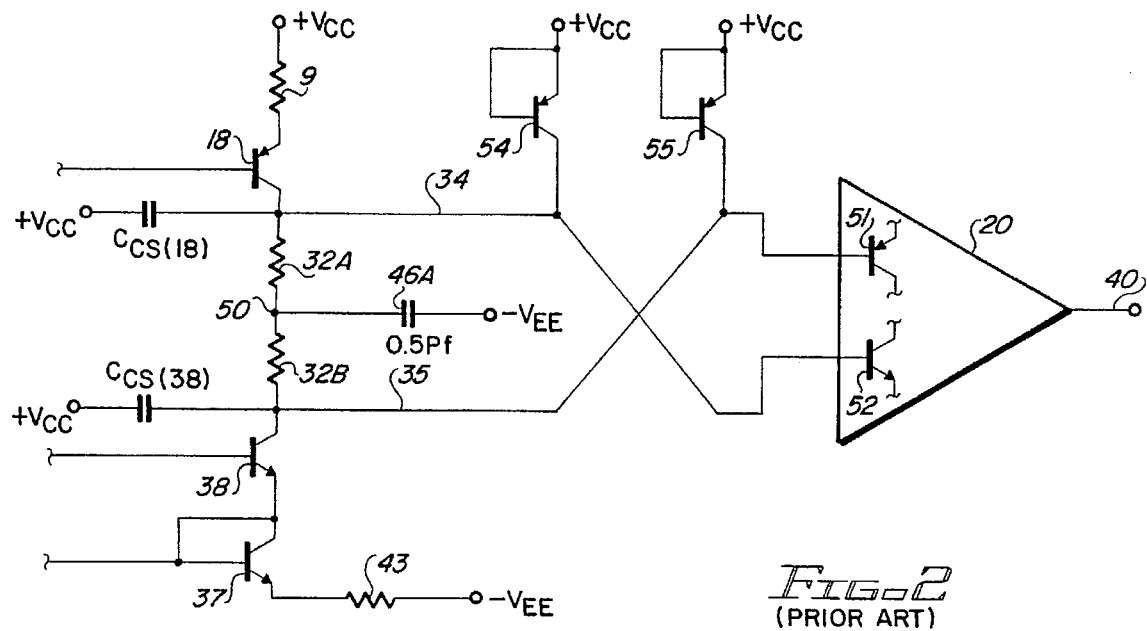
FIG. 2 is a schematic circuit diagram of a portion of a folded cascode gain stage applying a split differential output voltage to the base of the PNP and NPN input transistors 51 and 52 of a diamond follower of the closest prior art.

In accordance with the present invention, capacitor 46A of prior art FIG. 2 is not used, and instead a first linear capacitor 46 having a capacitance of approximately 0.6 picofarads is connected between $-V_{EE}$ and conductor 35, and a second linear capacitor 47 having a capacitance of approximately 0.1 picofarads is connected between $-V_{EE}$ and conductor 34.

Figure 3:
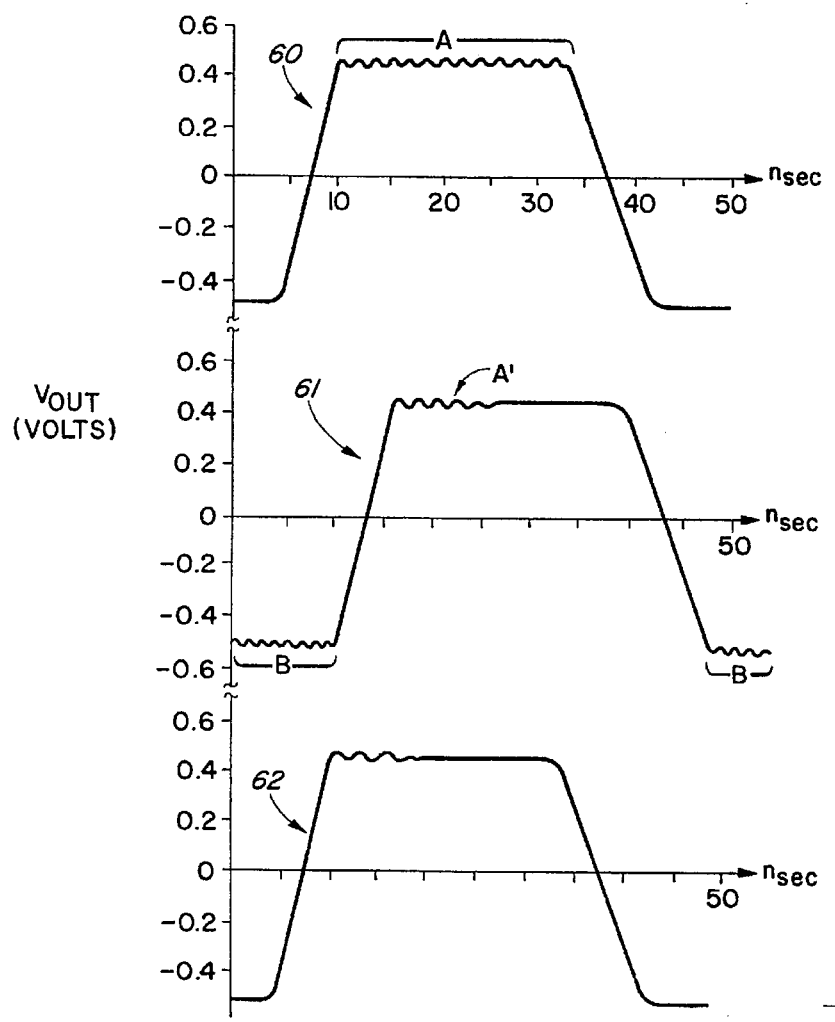
FIG. 3 is a graph that shows $V_{OUT}$ waveforms for the prior art and for the present invention.

Disconnecting 0.5 picofarad capacitor 46A from resistor junction conductor node 50 in FIG. 2, and instead connecting 0.6 picofarad capacitor 46 to conductor 35 as shown in FIG. 1A eliminated most of the instability indicated by A in waveform 60 of FIG. 3, causing $V_{OUT}$ on conductor 40 to instead appear as waveform 61 in FIG. 3. In waveform 61, "damped" oscillations A' appeared on waveform 61 rather than the sustained oscillations A of waveform 60. The damped oscillations A' obviously are much more satisfactory because reasonably short operational amplifier output settling times are achieved by waveform 61.

Unfortunately, a different sustained instability, indicated by B in waveform 61, appeared in $V_{OUT}$ waveform 61 when capacitor 46A was removed and capacitor 46 was connected as described above. Such sustained oscillations B were just as unacceptable as the sustained oscillations A in waveform 60 produced by the prior art circuit of FIG. 2.

After considerably more experimentation and evaluation, I finally connected a second compensation capacitor 47 of 0.1 picofarads between conductor 34 and $-V_{EE}$, as shown in FIG. 1A. This eliminated both the sustained oscillations A of waveform 60 and the sustained oscillations B of waveform 61 in FIG. 3, so to produce a "clean" $V_{OUT}$ waveform 62, also shown in FIG. 3. Waveform 62 is stable at levels of $V_{OUT}$ both above and below zero volts. (My computer simulations, using the well known program SPICE, indicated that the presence or absence of PNP junction capacitors 54 and 55 had little if any appreciable effect on the stability of $V_{OUT}$.)

I do not fully understand why removing the 0.5 picofarad capacitor 46A of prior art FIG. 2 and connecting 0.6 picofarad capacitor 46 between conductor 35 and $-V_{EE}$ and connecting 0.1 picofarad capacitor 47 between conductor 34 and $-V_{EE}$ eliminated the sustained instability described above. However, I suspect that the combined series resistance of resistors 32A and 32B together with the internal series resistance of capacitor 46A of prior art FIG. 2 caused a "zero" in the frequency response of the operational amplifier 30, and that a contributing factor to the associated instability was the fact that $C_{CS(18)}$ is approximately twenty times greater than $C_{CS(38)}$. When operational amplifier 30 is "biased up" so that $V_{OUT}$ is more than zero volts, i.e., for positive input voltages, there is much more current in the circuit leg including transistor 56 than in the leg including transistor 57.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, in some integrated circuit manufacturing processes, the collector-to-substrate capacitance of the NPN cascode transistor 38 might be much higher than that of the PNP cascode transistor 18. It might be feasible in some cases to omit NPN cascode transistor 38 and reconfigure the NPN current mirror with transistor 36 as the current mirror control transistor and transistor 37 as the current mirror output transistor and connect conductor 35 to the collector of transistor 37.

What is claimed is:

1. In a high speed integrated circuit operational amplifier including i. an input stage having first and second outputs, ii. first and second PNP cascode transistors, an emitter of the first PNP cascode transistor being coupled to the first output and an emitter of the second PNP cascode transistor being coupled to the second output, iii. an NPN cascode transistor having a base electrode coupled to a collector of the first PNP cascode transistor, a collector-to-substrate capacitance one of the NPN cascode transistor and the second PNP cascode transistor being much lower than a collector-to-substrate capacitance of the other of the NPN cascode transistor second PNP cascode transistor, iv. a resistive circuit coupled between a collector of the second PNP cascode transistor and a collector of the NPN cascode transistor, and v. a diamond follower output buffer having a first input coupled to the collector of the second PNP cascode transistor and a second input coupled to the collector of the NPN cascode transistor, the improvement comprising in combination:

(a) a first compensation capacitor coupled between a supply voltage conductor and the collector of the NPN cascode transistor; and (b) a second compensation capacitor coupled between the supply voltage conductor and the collector of the second PNP cascode transistor, to prevent instability of an output voltage of the diamond follower buffer circuit for high and low levels of the output voltage.

2. In the high speed integrated circuit operational amplifier recited in claim 1, the further improvement wherein the collector-to-substrate capacitance of the NPN cascode transistor is much lower than the collector-to-substrate capacitance of the second PNP cascode transistor.

3. In the high speed integrated circuit operational amplifier recited in claim 1, the further improvement wherein the first compensation capacitor is composed of a metal-insulator-semiconductor structure.

4. In the high speed integrated circuit operational amplifier of claim 1, the further improvement wherein the first compensation capacitor has a value of approximately 0.6 picofarads and the second compensation capacitor has a value of approximately 0.1 picofarads.

5. In the high speed integrated circuit operational amplifier of claim 1, the further improvement wherein the input stage includes first and second NPN emitter-coupled input transistors having their input coupled to a constant current source circuit and their collectors connected, respectively, to emitters of the first and second PNP cascode transistors.

6. In the high speed integrated circuit operational amplifier of claim 5, the further improvement wherein a base electrode of the NPN cascode transistor is coupled by a plurality of level shifting diodes to a collector of the first PNP cascode transistor, and also is connected to the collector of an NPN current mirror output transistor having its base electrode connected to the base electrode of an NPN current mirror control transistor having its base and collector connected to the emitter of the NPN cascode transistor.

7. In a high speed integrated circuit operational amplifier including i. an input stage having first and second outputs, ii. first and second PNP cascode transistors, an emitter of the first PNP cascode transistor being coupled to the first output and an emitter of the second PNP cascode transistor being coupled to the second output, iii. an NPN transistor having a base electrode coupled to a collector of the first PNP cascode transistor, a collector-to-substrate capacitance of one of the NPN transistor and the second PNP cascode transistor being much lower than a collector-to-substrate capacitance of the other of the NPN transistor second PNP cascode transistor, iv. a resistive circuit coupled between a collector of the second PNP cascode transistor and a collector of the NPN transistor, and v. a diamond follower output buffer having a first input coupled to the collector of the second PNP cascode transistor and a second input coupled to the collector of the NPN transistor, the improvement comprising in combination:

(a) a first compensation capacitor coupled between a supply voltage conductor and the collector of the NPN transistor; and (b) a second compensation capacitor coupled between the supply voltage conductor and the collector of the second PNP cascode transistor, to prevent instability of an output voltage of the diamond follower buffer circuit for high and low levels of the output voltage.

* * * * *